United States Patent
Wang et al.

(10) Patent No.: US 11,296,033 B2
(45) Date of Patent: Apr. 5, 2022

(54) FAN-OUT MULTI-DEVICE HYBRID INTEGRATED FLEXIBLE MICRO SYSTEM AND FABRICATION METHOD THEREOF

(71) Applicant: Peking University, Beijing (CN)

(72) Inventors: Wei Wang, Beijing (CN); Xiao Dong, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 16/473,582

(22) PCT Filed: Dec. 11, 2018

(86) PCT No.: PCT/CN2018/120227
§ 371 (c)(1),
(2) Date: Jun. 25, 2019

(87) PCT Pub. No.: WO2019/233072
PCT Pub. Date: Dec. 12, 2019

(65) Prior Publication Data
US 2021/0358853 A1     Nov. 18, 2021

(30) Foreign Application Priority Data

Jun. 8, 2018 (CN) .......................... 201810586370.6

(51) Int. Cl.
*H01L 23/538* (2006.01)
*H01L 21/50* (2006.01)
*H01L 23/14* (2006.01)

(52) U.S. Cl.
CPC .......... *H01L 23/5387* (2013.01); *H01L 21/50* (2013.01); *H01L 23/145* (2013.01)

(58) Field of Classification Search
CPC .... H01L 23/145; H01L 23/5387; H01L 21/50
USPC .......................................................... 257/668
See application file for complete search history.

(56) References Cited

U.S. PATENT DOCUMENTS

2002/0182778 A1    12/2002  Wang
2019/0096851 A1*    3/2019  Liao ........................ H01L 24/96

FOREIGN PATENT DOCUMENTS

| CN | 202003990 | 10/2011 |
| CN | 102543924 | 7/2012 |
| CN | 103681458 | 3/2014 |
| CN | 106025050 | 10/2016 |
| CN | 106684003 | 5/2017 |
| CN | 206955629 | 2/2018 |

(Continued)

*Primary Examiner* — Quoc D Hoang
(74) *Attorney, Agent, or Firm* — SV Patent Service

(57) ABSTRACT

The invention discloses a fan-out multi-device hybrid integrated flexible micro-system and an associated fabrication method in the field of microelectronics. The flexible micro-system uses microelectromechanical system (MEMS) chips and/or integrated circuit (IC) chips as the device units, flexible isolation trenches filled with flexible polymer as a flexible connection between the device units, and metal wiring layers to provide electrical interconnections between the device units. The disclosed multi-device hybrid integrated flexible micro-system completed by a fan-out method not only retains excellent electrical performance of silicon-based devices, but also realizes flexibility of the overall micro-system, and has stable structure and reliable performance.

7 Claims, 3 Drawing Sheets

(56) References Cited

FOREIGN PATENT DOCUMENTS

CN 105448648 B 9/2018
TW 201539699 A 10/2015

* cited by examiner

FAN-OUT MULTI-DEVICE HYBRID INTEGRATED FLEXIBLE MICRO SYSTEM AND FABRICATION METHOD THEREOF

TECHNICAL FIELD

The invention relates to the field of semiconductor manufacturing, and in particular, to a multi-device hybrid integrated flexible micro system and a fabrication method thereof.

BACKGROUND OF THE INVENTION

The fan-out package technology is a wafer-level packaging technology based on wafer reconstruction technology, which re-arranges a chip onto a manual wafer for packaging. This method can accomplish smaller and thinner package, achieve hybrid integration of multiple devices, and can improve efficiency and reduce costs through batch processing. The method has a wide range of applications in the fields of packaging of portable electronic product chips, memory chip packaging, and the like.

Flexible electronics are electronic technologies that make organic/inorganic material electronics on flexible materials. Due to its unique flexibility/ductility and efficient, low-cost manufacturing processes, flexible electronics technology has broad application prospects in the fields of information, energy, medical, and defense. At present, flexible electronics mainly has two fabrication strategies: one is to directly realize the flexibility of the electronic device by using a flexible functional material; the other is to transfer rigid electronic components to a flexible substrate. For the former method, the fabrication of organic semiconductor materials is a critical step. Due to the flexible nature of the organic semiconductor, the flexible process of the method is simple, and it is easy to realize printing, patterning, and thin film forming, thereby forming a flexible electronics device. However, for the currently known organic semiconductors, low mobility is still an important factor limiting its performance. For example, a recently reported elastomeric organic semiconductor material can maintain a mobility of more than 1.0 $cm^2/V \cdot s$ when it is stretched from the original length to twice the original length, but this is still much smaller than the current carrier mobility of silicon ($10^2$-$10^3$ $cm^2/V \cdot s$). Compared with organic semiconductor materials, inorganic semiconductor materials represented by silicon not only have higher mobility, but also have formed a mature fabrication process. Flexibility of the silicon-based structure can be achieved by a suitable method to obtain high-performance flexible electronics devices. For the latter method, the key idea is to use a silicon structure having a small thickness (<10 µm) and produce three-dimensional topology change using auxiliary elastic member, to obtain flexible silicon-based devices. But for these complex MEMS device structures, the small thickness will affect the structural strengths of the devices, which makes it inconvenient for the above method to fabricate flexible electronics devices with reliable structures.

In view of the above, there is a need for a flexible micro system processing technology to fabricate highly reliable flexible electronics with excellent electrical properties.

SUMMARY OF THE INVENTION

In view of the technical problems in the current flexible electronics fabrication methods, the purpose of the present invention is to provide a fan-out multi-device hybrid integrated flexible micro system and a fabrication method thereof, which can ensure the good electrical performance and sufficiently reliable structural strength in the complex flexible electronics devices.

The technical solutions adopted by the present invention is as follows:

A fan-out multi-device hybrid integrated flexible micro system includes device units comprising microelectromechanical system (MEMS) chips or integrated circuit (IC) chips, flexible connection between the device units including flexible isolation trench and a flexible polymer filling at least a portion of the isolation trench; and metal wiring layer used to provide electrical interconnection between the device units.

Further, the MEMS chips or the integrated circuit chips can be provided fabricated from a same fabrication process or different fabrication processes. The MEMS chip can be a sensing chip array. The integrated circuit chip can be a single circuit chip or a circuit chip array.

Further, the polymer can include parylene and other flexible materials which are formed by the chemical vapor deposition process.

Further, the flexible isolation trench can comprise high aspect ratio silicon trenches etched between the device units and the polymer filled in the trenches. The remaining silicon in the flexible isolation trench can also be removed by etching, then the polymer can be deposited again to form a flexible connection comprising flexible polymer entirely between the units.

Further, the flexible connection is configured to provide flexible and flat interconnections between rigid device units.

Further, the metal wiring layer can be a single layer or a plurality of layers. The plurality of layers can be electrically isolated by the flexible material deposited between the layers.

Accordingly, the present invention provides a method for fabricating a fan-out multi-device hybrid integrated flexible micro system, the method comprising the steps of:

1) making a pattern for chip positioning on a front surface of a silicon wafer;

2) bonding front sides of the sensing array chip, the circuit chip or the circuit array chip to the front surface of the silicon wafer at positions defined by the pattern;

3) pasting an adhesive on the front surface of the wafer that is bonded with chips, and bonding to a front surface of a temporary carrier wafer formed by another silicon wafer;

4) stripping off the silicon wafer on the front sides of the chips to expose the front sides of the chips;

5) performing photolithography on the front side of the chips and the temporary carrier wafer, forming isolation trenches by deep etching to obtain separated MEMS chip array separated by the isolation trenches and separated integrated circuit (IC) chip array separated by the flexible isolation trench;

6) depositing a layer of polymer on the front side of the chips and the temporary carrier wafer to fill the isolation trenches to form a flexible connection structure;

7) performing photolithography on the front side of the chips and the temporary carrier wafer; etching the deposited polymer using oxygen plasma to form interconnection windows for the metal wiring layer on the front side of the chips and the temporary carrier wafer; 8) performing photolithography and sputtering of a seed layer on the front side of the chips and the temporary carrier wafer, forming a metal wiring layer between the pads of the chips by electroplating, completing electrical interconnections between the MEMS chips and the IC chips;

9) depositing a layer of polymer on the front side of the chips and the temporary carrier wafer as an electrical isolation protection, performing photolithography and etching the deposited polymer by oxygen plasma to form interconnection windows between the metal wiring layer and outside;

10) bonding the front side of the chips and the temporary carrier wafer onto another silicon wafer, and peeling off the temporary carrier wafer;

11) performing photolithography on the back side of the chips on the silicon wafer, etching residual silicon in the isolation trenches, depositing a layer of polymer for protection to form a multi-device hybrid integrated flexible micro system.

Further, in step 3), after adhesive is pasted on the front surface of the patterned wafer that is bonded with the chips and before the temporary carrier sheet is bonded, the back surface of the chips can be thinned to a predetermined thickness using CMP.

The beneficial effects of the present invention are as follows:

(1) The technical solution disclosed by the present invention can realize flexible hybrid integration of a plurality of different devices to produce a flexible micro system with complete functions.

(2) Compared with conventional flexible electronics flexible technologies, the present invention uses silicon-based chips as the functional units, thus having excellent electrical properties in the associated circuit. The chips used in the present invention do not need to be too thin, thereby ensuring structural strengths and normal operations of the complex structured devices.

DETAILED DESCRIPTION OF IMPLEMENTATIONS

Figure 1:
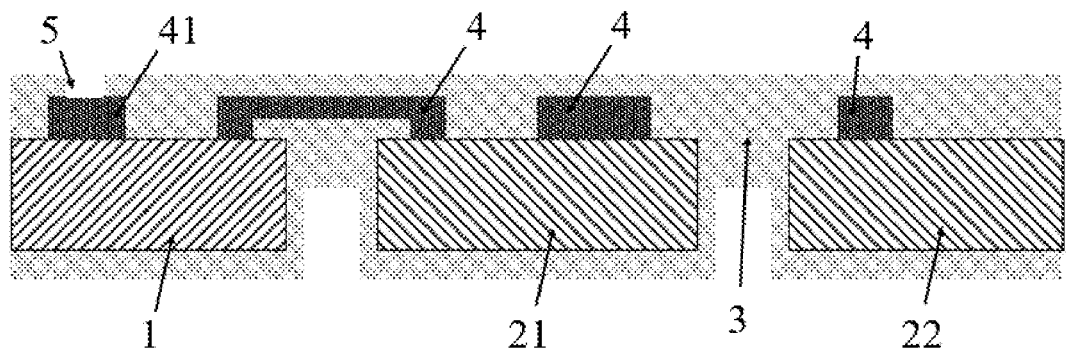
FIG. 1 is a structure schematic diagram of a fan-out multi-device hybrid integrated flexible micro system in accordance to the present invention.

The invention will be described in detail below with reference to the specific embodiments and drawings. The examples of the embodiments are illustrated in the drawings, wherein the same or similar reference numerals indicate the same or similar elements. The embodiments described below with reference to the drawings are intended to be illustrative of the invention and are not to be construed as limiting.

This implementation example provides a structure of a fan-out multi-device hybrid integrated flexible micro system. Referring to FIG. 1, at least two types of chips are included (a single type can also be used in other implementations), a chip 1, an array chip 2 divided into two chips 21 and 22, wherein the chips 1, 21, 22 are connected by a flexible material 3. The front side of the chips 1, 21, 22 is micro-fabricated and needs electrical interconnection. The electrical interconnection between the chips 1, 21, 22 is completed by the metal wiring layer 4 on the front side of the chips 1, 21, 22. The surface of the chips 1, 21, 22 and the metal wiring layer 4 are protected by a flexible material 3. A solder joint 41 on the metal wiring layer 4 is electrical contact with the outside. The flexible material 3 on the solder joint 41 is removed to form a hole 5, thereby exposing the solder joint 41.

Figure 2:
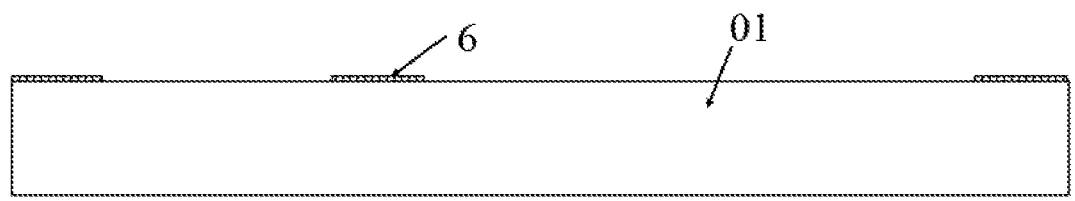
FIG. 2 is a vertical cross-sectional schematic view showing forming a positioning pattern on a transfer carrier wafer in accordance to some embodiments the present invention.

The fan-out multi-device hybrid integrated flexible micro system in the current implementation example can be formed by the following processing steps:

(1) A positioning pattern 6 is formed on the surface of a transfer carrier wafer 01, as shown in FIG. 2. The positioning pattern 6 can be prepared by sputtering or evaporating a layer of metal on the surface of the transfer carrier wafer 01, followed by photolithography, etching, and removing the photoresist.

Figure 3:
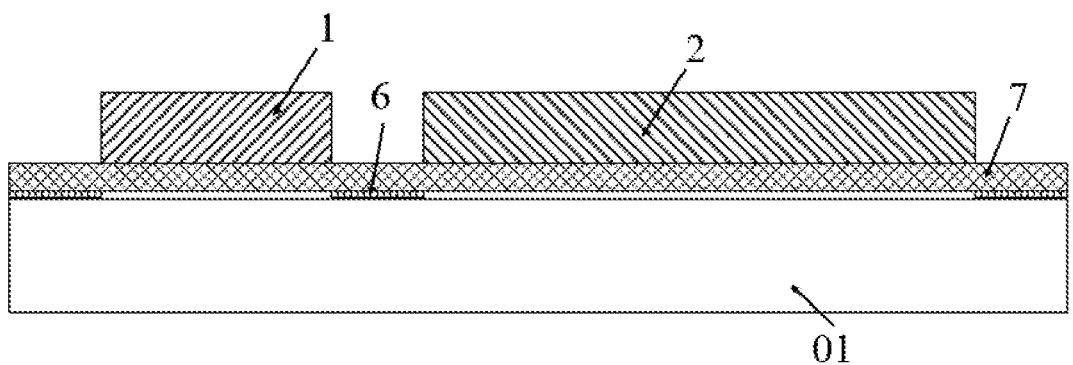
FIG. 3 is a vertical cross-sectional schematic view showing bonding the front sides of the chips to a transfer carrier wafer in accordance to some embodiments the present invention.

(2) Using an adhesive material 7, the chip 1 and the array chip 2 are bonded to the surface of the transfer carrier wafer 01, as shown in FIG. 3. The array chip 2 is composed of two identical chips 21 and 22, which are connected and face downward.

Figure 4:
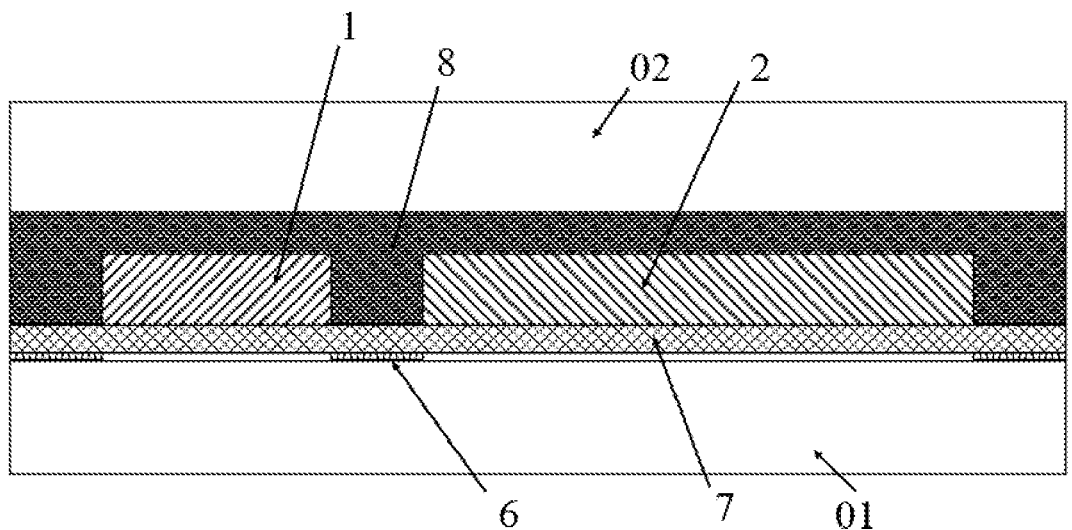
FIG. 4 is a vertical cross-sectional schematic view showing bonding the back sides of the chips to a temporary carrier wafer in accordance to some embodiments the present invention.

(3) Another adhesive material 8 is used to bond the back of the chips 1 and 2 to a temporary carrier wafer 02, as shown in FIG. 4.

Figure 5:
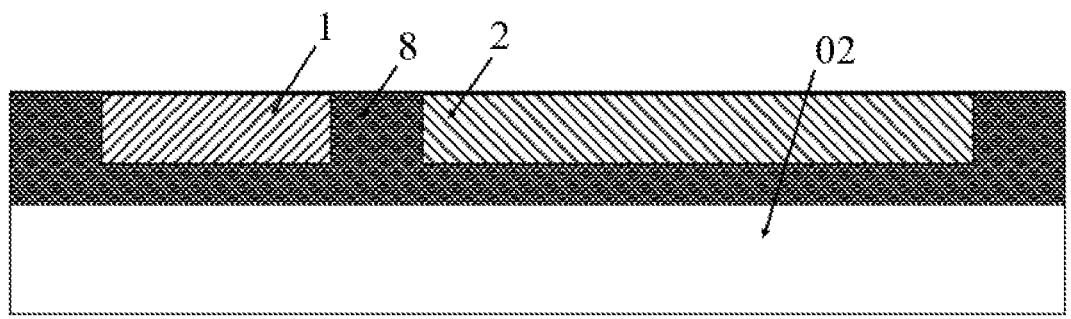
FIG. 5 is a vertical cross-sectional schematic view showing separating the chips from the transfer carrier wafer in accordance to some embodiments the present invention.

(4) The transfer carrier wafer 01 and the adhesive material 7 is removed, to expose the front surfaces of the chip 1 and the array chip 2, as shown in FIG. 5.

Figure 6:
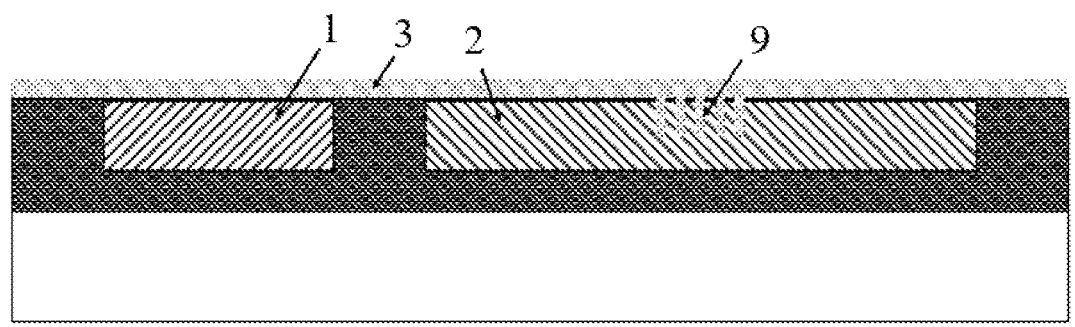
FIG. 6 is a vertical schematic cross-sectional view after the flexible trenches are etched on the front side of the array chip and the flexible material is deposited in accordance to some embodiments the present invention.

(5) Isolation trenches 9 is etched in the front side of the array chip 2 after photolithography, which divides the chip 2 into two chips 21 and 22. A flexible material 3 is then deposited, as shown in FIG. 6.

Figure 7:
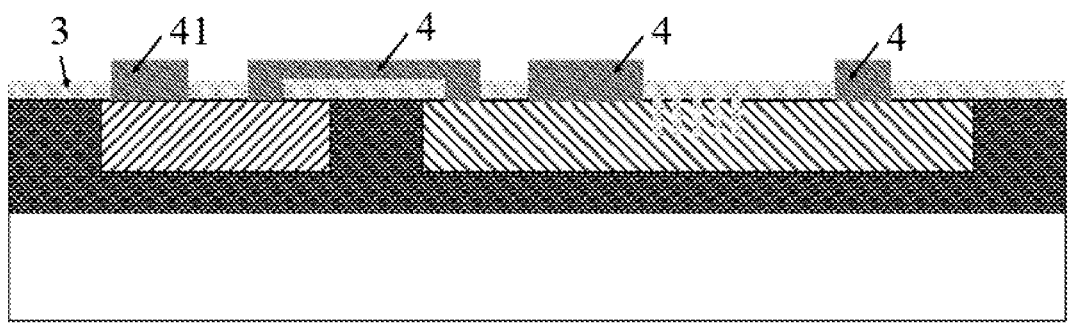
FIG. 7 is a schematic cross-sectional view showing a metal wiring layer formed on the surface of the flexible material in accordance to some embodiments the present invention.

(6) The flexible material 3 above the pads on the front side of the chips is etched, and the metal is processed to form a metal wiring layer 4. The metal wiring layer 4 can be formed using processing steps of photolithography, depositing a seed layer, electroplating, and lift-off, with result shown in FIG. 7.

Figure 8:
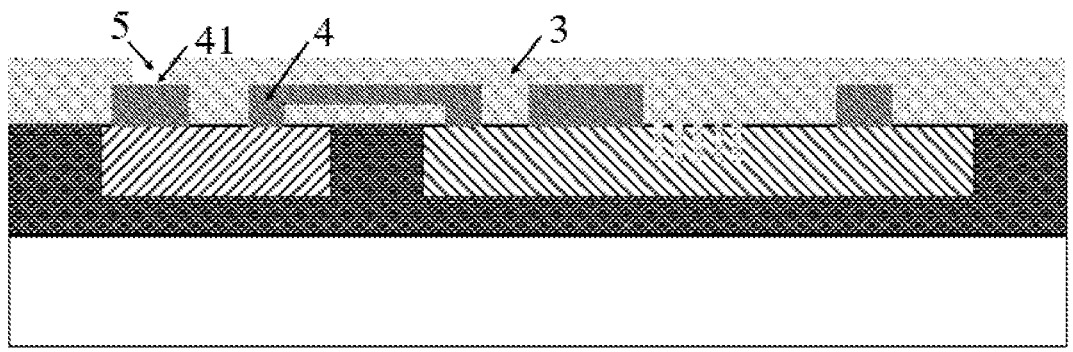
FIG. 8 is a schematic cross-sectional view showing the flexible material deposited on the metal wiring layer, the interconnected pads of the metal wiring layer exposed after the etching of the flexible material, and the pads that can be interconnected to external electrical components in accordance to some embodiments the present invention.

(7) The surface of the metal wiring layer 4 is then deposited with a flexible material, which is then etched after photolithography, to form a hole 5 to expose a pad 41, which is the portion of the metal wiring layer 4 for external electrical interconnection, as shown in FIG. 8.

Figure 9:
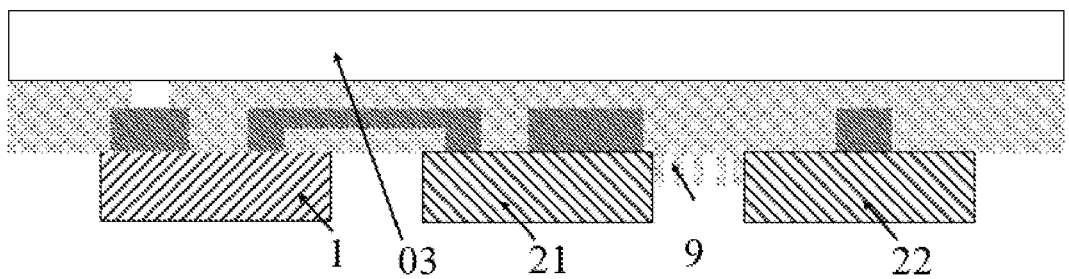
FIG. 9 is a schematic cross-sectional view after the temporary carrier wafer is removed from the back side of the chips, the remaining silicon in and under the isolation trenches was etched away in accordance to some embodiments the present invention.

(8) Another silicon wafer 03 is bonded on the front surface of the chips 1, 21, 22. The temporary carrier wafer 02 and the bonding material 8 are removed. Then the residual silicon under the isolation trenches 9 and inside is removed by etching after photolithography. The array chip 2 is completely divided into chip 21 and chip 22 connected by a flexible material, as shown FIG. 9.

Figure 10:
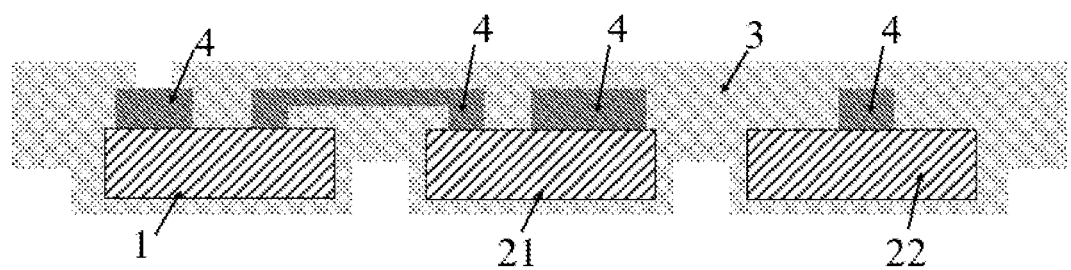
FIG. 10 is a schematic cross-sectional view showing the structure of a flexible material deposited on the back side of the chips in accordance to some embodiments the present invention.

(9) The silicon wafer 03 is removed. A flexible material 3 is deposited on the back surfaces of the chip 1, 21, 22. Finally, the chips 1, 21, 22 are wrapped and connected by the flexible material 3 and electrically interconnected by the metal wiring layer 4, as shown FIG. 10.

The above embodiments are only used to illustrate the technical solutions of the present invention, and the present invention is not limited thereto, and those skilled in the art can modify or replace the technical solutions of the present invention without departing from the spirit and scope of the present invention. The scope of protection shall be as stated in the claims.

What is claimed is:

1. A fan-out multi-device hybrid integrated flexible micro system, comprising:
    device units each comprising at least one microelectromechanical system (MEMS) chip or at least one integrated circuit (IC) chip;
    a flexible connection between the device units, wherein the flexible connection includes flexible isolation trenches filled with a flexible polymer, wherein the flexible isolation trenches comprise silicon trenches etched between the device units and the flexible polymer in the flexible isolation trenches, wherein remaining silicon in the flexible isolation trenches is removed by etching, wherein the flexible connection is formed by deposition of additional flexible polymer between the device units; and
    metal wiring layers configured to provide electrical interconnection between the device units.

2. The fan-out multi-device hybrid integrated flexible micro system of claim 1, wherein the at least one MEMS chip or the at least one integrated circuit chip is fabricated in a same fabrication process or different fabrication processes,
    wherein the at least one MEMS chip is a sensing chip array comprising an array of sensing units,
    wherein the integrated circuit chip is a single circuit chip or a circuit chip array comprising an array of circuit units.

3. The fan-out multi-device hybrid integrated flexible micro system of claim 1, wherein the flexible polymer includes parylene formed by chemical vapor deposition.

4. The fan-out multi-device hybrid integrated flexible micro system of claim 1, wherein the flexible connection is configured to provide flexible and flat interconnections between the device units that are rigid.

5. The fan-out multi-device hybrid integrated flexible micro system of claim 1, wherein the metal wiring layer includes a single layer or a plurality of layers, wherein the plurality of layers are electrically isolated by the flexible material deposited between the layers.

6. A method for fabricating a fan-out multi-device hybrid integrated flexible micro system, comprising:
    making a pattern for chip positioning on a front surface of a silicon wafer;
    bonding front sides of the sensing array chip, the circuit chip or the circuit array chip to the front surface of the silicon wafer at positions defined by the pattern;
    pasting an adhesive on the front surface of the wafer that is bonded with chips, and bonding to a front surface of a temporary carrier wafer formed by another silicon wafer;
    stripping off the silicon wafer on the front sides of the chips to expose the front sides of the chips;
    performing photolithography on the front side of the chips and the temporary carrier wafer, forming isolation trenches by deep etching to obtain separated microelectromechanical system (MEMS) chip array separated by the isolation trenches and separated integrated circuit (IC) chip array separated by the flexible isolation trench;
    depositing a layer of polymer on the front side of the separated by the isolation trenches and separated integrated circuit (IC) chip array separated by the flexible isolation trench to fill the isolation trenches to form a flexible connection structure;
    performing photolithography on the front side of the separated by the isolation trenches and separated integrated circuit (IC) chip array separated by the flexible isolation trench; etching the deposited polymer using oxygen plasma to form an interconnection windows for the metal wiring layer on the front side of the chips and the temporary carrier wafer;
    performing photolithography and sputtering of a seed layer on the front side of the chips and the temporary carrier wafer, forming a metal wiring layer between the pads of the chips by electroplating, completing electrical interconnections between the MEMS chips and the IC chips;
    depositing a layer of polymer on the front side of the chips and the temporary carrier wafer as an electrical isolation protection, performing photolithography and etching the deposited polymer by oxygen plasma to form interconnection windows between the metal wiring layer and outside;
    bonding the front side of the chips and the temporary carrier wafer onto a silicon wafer, and peeling off the temporary carrier wafer; and
    performing photolithography on the back side of the chips on the silicon wafer, etching residual silicon in and under the isolation trenches and between the isolation trenches, depositing a layer of polymer for protection to form a multi-device hybrid integrated flexible micro system.

7. The method of claim 6, wherein the back surface of the chips is thinned to a predetermined thickness using CMP after adhesive is pasted on the front surface of the patterned wafer that is bonded with the chips and before the temporary carrier sheet is bonded.

* * * * *